(12) United States Patent //
Suzuki

(10) Patent No.: US 7,420,414 B2
(45) Date of Patent: Sep. 2, 2008

(54) AMPLIFIER, AND STEP-DOWN REGULATOR AND OPERATIONAL AMPLIFIER USING THE AMPLIFIER

(75) Inventor: Koji Suzuki, Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 57 days.

(21) Appl. No.: 11/650,951

(22) Filed: Jan. 9, 2007

(65) Prior Publication Data

US 2007/0200623 A1 Aug. 30, 2007

(30) Foreign Application Priority Data

Feb. 28, 2006 (JP) .............................. 2006-054139

(51) Int. Cl.
*H03G 3/20* (2006.01)
(52) U.S. Cl. ........................................ 330/127; 330/85
(58) Field of Classification Search .................. 330/260, 330/85, 259, 255
See application file for complete search history.

(56) References Cited

U.S. PATENT DOCUMENTS 6,066,985 A * 5/2000 Xu .............................. 330/253
6,566,952 B1 * 5/2003 Allan .......................... 330/255

FOREIGN PATENT DOCUMENTS

JP 2003-330550 11/2003
JP 2004-118411 4/2004

* cited by examiner

*Primary Examiner*—Benny Lee
*Assistant Examiner*—Hieu P Nguyen
(74) *Attorney, Agent, or Firm*—Volentine & Whitt, P.L.L.C.

(57) ABSTRACT

An amplifier has an input stage amplifying circuit, an output stage amplifying circuit, and a negative feedback circuit. The input stage amplifying circuit differential-amplifies a first input voltage inputted to a positive phase input node and a second input voltage inputted to an opposite phase input node, and outputs from a positive phase output node. The output stage amplifying circuit amplifies output voltage from a node and outputs it from an output terminal, and generates the second input voltage corresponding to output voltage and feedback-inputs it to the opposite phase input node. The negative feedback circuit has a first PMOS for a current source whose output current fluctuates due to output voltage of the positive phase output node, and a differential amplifying section to which the output current of the first PMOS is supplied and which is formed from a second and third PMOS which differential-amplify the first input voltage and the second input voltage. The negative feedback circuit feeds-back, to an opposite phase output node, a positive phase current corresponding to output current of the differential amplifying section.

8 Claims, 6 Drawing Sheets

US 7,420,414 B2

AMPLIFIER, AND STEP-DOWN REGULATOR AND OPERATIONAL AMPLIFIER USING THE AMPLIFIER

CROSS-REFERENCE TO RELATED APPLICATION

This application claims priority under 35 USC 119 from Japanese Patent Application No. 2006-054139, the disclosure of which is incorporated by reference herein.

BACKGROUND OF THE INVENTION

1. Field of the Invention

The present invention relates to an amplifier (hereinafter called "amp") in a semiconductor integrated circuit, and to a step-down regulator which, by using the amp, outputs a constant voltage which is lower than a power source voltage, and to an operational amplifier (hereinafter called "operational amp") using the amp.

2. Description of the Related Art

For example, the following documents and the like include disclosure of conventional techniques relating to an amp provided at a semiconductor integrated circuit, or a constant voltage power source circuit (voltage regulator) or step-down regulator or the like which uses the amp.

Japanese Patent Application Laid-Open (JP-A) No. 2003-330550

Japanese Patent Application Laid-Open (JP-A) No. 2004-118411

The technique of a constant voltage power source circuit is disclosed in JP-A No. 2003-330550. This constant voltage power source circuit has: an input stage amplifying circuit; an intermediate stage amplifying circuit which amplifies the output voltage of the input stage amplifying circuit; and an output stage amplifying circuit which amplifies the output voltage of the intermediate stage amplifying circuit. A bias circuit, which varies the bias current of the intermediate stage amplifying circuit proportionately to the output current of the output stage amplifying circuit, is provided within the intermediate stage amplifying circuit. In this way, even when a load whose fluctuations in consumed current are large is connected to the output terminal of the output stage amplifying circuit, the bias current of a transistor for driving within the intermediate stage amplifying circuit can be made to be small, and the capacity of a capacitor for phase compensation which is connected to the output terminal can be made to be small.

The technique of a voltage regulator is disclosed in JP-A No. 2004-118411. This voltage regulator has: a reference voltage source which outputs a reference voltage; a voltage dividing circuit which divides output voltage; a feedback voltage terminal to which a voltage obtained by dividing the output voltage is outputted; an error amp to which the reference voltage and voltage from the feedback voltage terminal are inputted; a first transistor connected in series between the voltage dividing circuit and the input power source voltage; and an overcurrent limiting circuit which receives output of the error amp, and outputs a signal that controls the first transistor. The overcurrent limiting circuit has a differential pair which receives a signal which is inputted to the error amp, and outputs the signal that controls the first transistor. Therefore, even when the input power source voltage and the output voltage are small (i.e., when the input/output voltage difference is small), the overcurrent limiting circuit operates and limits the increase in the output current and lowers the output voltage. A constant output voltage can thereby be outputted.

Further, as a conventional step-down regulator provided at a semiconductor integrated circuit, there is the structure shown in FIG. 6 for example.

FIG. 6 is a circuit diagram showing a structural example of a conventional step-down regulator.

This step-down regulator is structured by using an operational amp 10, and, on the basis of reference voltage VR, outputs a desired output voltage Vout, which is lower than a positive power source voltage (hereinafter called "VDD") from an output terminal REGOUT. A large capacitor C1 for stabilization of from several to several 10 µF is connected between the output terminal REGOUT and the ground (hereinafter called "GND"). Therefore, the operational amp 10 is structured so as to not have a phase compensating capacitor for preventing oscillation.

The operational amp 10 is structured from an input stage amplifying circuit 10A, and an output stage amplifying circuit 10B connected to the output side thereof. The input stage amplifying circuit 10A has a current source 11 and an N-channel MOS transistor (hereinafter called "NMOS") 12, and these are connected in series between the VDD node and the GND. An NMOS 13 for the current source, which together with the NMOS 12 structures a current mirror circuit, is connected to the NMOS 12. NMOS 14, 15 which structure a differential amplifying section, P-channel transistors (hereinafter called "PMOS") 16, 17 which structure a current mirror circuit, and the VDD node are connected in series to the NMOS 13. The reference voltage VR is inputted to the gate of the NMOS 15.

The output stage amplifying circuit 10B has a PMOS 18 for output, the output terminal REGOUT, and an NMOS 19, and these are connected in series between the VDD node and the GND. The PMOS 18 is an output transistor which is gate-controlled by the drain of the NMOS 15 and the drain of the PMOS 17. The NMOS 19, together with the NMOS 12, 13, structures a current mirror circuit. A voltage-dividing circuit, which is structured from voltage-dividing resistors 21, 22, is connected between the output terminal REGOUT and the GND. The divided voltage is feedback-inputted to the gate of the NMOS 14.

In the step-down regulator of this structure, in a case in which the output voltage Vout fluctuates due to fluctuations in the load connected to the output terminal REGOUT, the amount of fluctuation is detected by the voltage-dividing resistors 21, 22, and the detected voltage is feedback-inputted to the gate of the NMOS 14 of the differential amplifying section. The difference between the reference voltage VR and the detected voltage is amplified by the NMOS 14, 15 of the differential amplifying section. The NMOS 18 is gate-controlled by the amplified voltage, and the output voltage Vout on the output terminal REGOUT is controlled to a constant voltage.

However, there are the following problems (a) through (c) with the conventional step-down regulator.

(a) In the conventional step-down regulator, phase compensation is carried out in accordance with the capacitance value of the capacitor C1 which is connected to the output terminal REGOUT. Therefore, if the capacitance value of the capacitor C1 is made to be small, the phase margin becomes small, and there is the problem that oscillation occurs.

(b) At the time of the start of operation of the step-down regulator, due to the rush current (overcurrent) to the capacitor C1 which is connected to the output terminal REGOUT, the voltage greatly exceeds (overshoots) the constant voltage, and thereafter, stabilizes at the constant voltage. Therefore, there are the problems that the circuit elements deteriorate due to this overcurrent, the time from the overshooting until the stabilization at the constant voltage is long, and the rise at the time of start of operation is slow.

(c) In order to overcome above-described problems (a), (b), it has been thought to use the technique disclosed in JP-A No. 2003-330550 or JP-A No. 2004-118411.

For example, it can be thought to provide the intermediate stage amplifying circuit, which has a bias circuit and is disclosed in JP-A No. 2003-330550, between the input stage amplifying circuit 10A and the output stage amplifying circuit 10B, and to vary the bias current of the transistor for driving within the intermediate stage amplifying circuit proportionately to the output current of the output stage amplifying circuit 10B by this bias circuit, and control the gate voltage of the PMOS 18 for output. However, the doubt remains as to whether or not the phase margin can be improved (i.e., the capacitance value of the capacitor C1 can be made small) without adversely affecting the other circuit portions, and even if it were possible to make the capacitance value of the capacitor C1 small, the prevention of overcurrent, which is the problem of above-described (b), could not be achieved.

In order to achieve prevention of overcurrent, it can be thought to use the technique of the overcurrent limiting circuit disclosed in JP-A No. 2004-118411. However, JP-A No. 2004-118411 does not have a technique relating to phase compensation, and has a different circuit structure than JP-A No. 2003-330550 and the technique of FIG. 6. Therefore, combining the technique of the overcurrent limiting circuit disclosed in JP-A No. 2004-118411 with JP-A No. 2003-330550 or the circuit of FIG. 6 is itself technically impossible. It is difficult to achieve prevention of overcurrent without uselessly complicating the circuit structure, and further, without increasing the scale of the circuit.

SUMMARY OF THE INVENTION

The amplifier, step-down regulator, or operational amplifier of the present invention has an input stage amplifying circuit, an output stage amplifying circuit, and a negative feedback circuit.

The input stage amplifying circuit is a circuit which has a positive phase input node, an opposite phase input node, a positive phase output node and an opposite phase output node, and differential-amplifies a first input voltage inputted to the positive phase input node and a second input voltage inputted to the opposite phase input node, and outputs an input stage output voltage from the positive phase output node. The output stage amplifying circuit is a circuit which amplifies the input stage output voltage and outputs an output stage output voltage from an output stage output node, and generates the second input voltage which corresponds to the output stage output voltage, and feedback-inputs the second input voltage to the opposite phase input node. Further, the negative feedback circuit is a circuit which has a current source whose output current fluctuates due to the input stage output voltage, and a differential amplifying section to which the output current of the current source is supplied and which differential-amplifies the first input voltage and the second input voltage, and the negative feedback circuit feeds-back, to the opposite phase output node, a positive phase current which corresponds to output current of the differential amplifying section.

In accordance with the amplifier, the step-down regulator, or the operational amplifier of the present invention, because a negative feedback circuit is provided, even if the capacity of the capacitor for stabilization is made to be small, the phase margin is enlarged, and a stable circuit which does not oscillate can be obtained. Further, due to a circuit structure which is relatively simple, the output voltage at the time of start of operation is converged stably and the rise time is quickened, and overcurrent can be prevented accurately, without increasing the scale of the circuit.

BRIEF DESCRIPTION OF THE DRAWINGS

Preferred exemplary embodiments of the present invention will be described in detail based on the following figures, wherein.

DETAILED DESCRIPTION OF THE INVENTION

An amplifier has an input stage amplifying circuit, an output stage amplifying circuit, and a negative feedback circuit.

The input stage amplifying circuit is a circuit having a positive phase input node, an opposite phase input node, a positive phase output node and an opposite phase output node, and differential-amplifying a first input voltage inputted to the positive phase input node and a second input voltage inputted to the opposite phase input node, and outputting an input stage output voltage from the positive phase output node.

The output stage amplifying circuit has an output transistor which amplifies the input stage output voltage and outputs an output stage output voltage from an output stage output node, and a voltage-dividing circuit which, by dividing the output stage output voltage, generates the second input voltage, and feedback-inputs the second input voltage to the opposite phase input node.

The negative feedback circuit has a current source whose output current fluctuates due to the input stage output voltage, and a differential amplifying section to which the output current of the current source is supplied and which differential-amplifies the first input voltage and the second input voltage, and a current mirror circuit which turns-back output current of the differential amplifying section and feeds-back a positive phase current thereof to the opposite phase output node.

First Exemplary Embodiment (Structure of a First Exemplary Embodiment)

Figure 1:
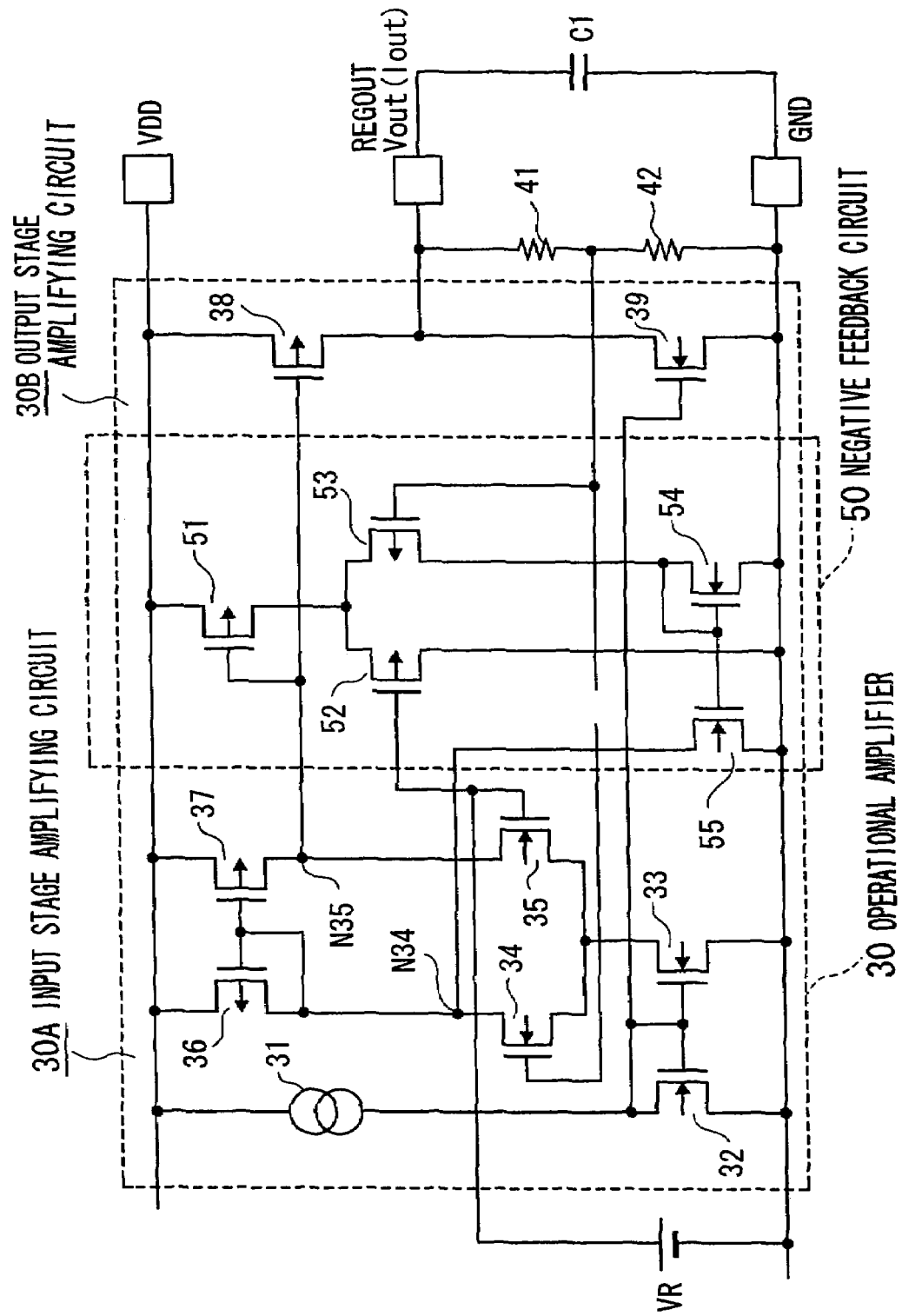
FIG. 1 is a circuit diagram of an amplifier (e.g., a step-down regulator), illustrating a first exemplary embodiment of the present invention.

FIG. 1 is a circuit diagram of an amplifier (e.g., a step-down regulator), illustrating a first exemplary embodiment of the present invention.

Figure 6:
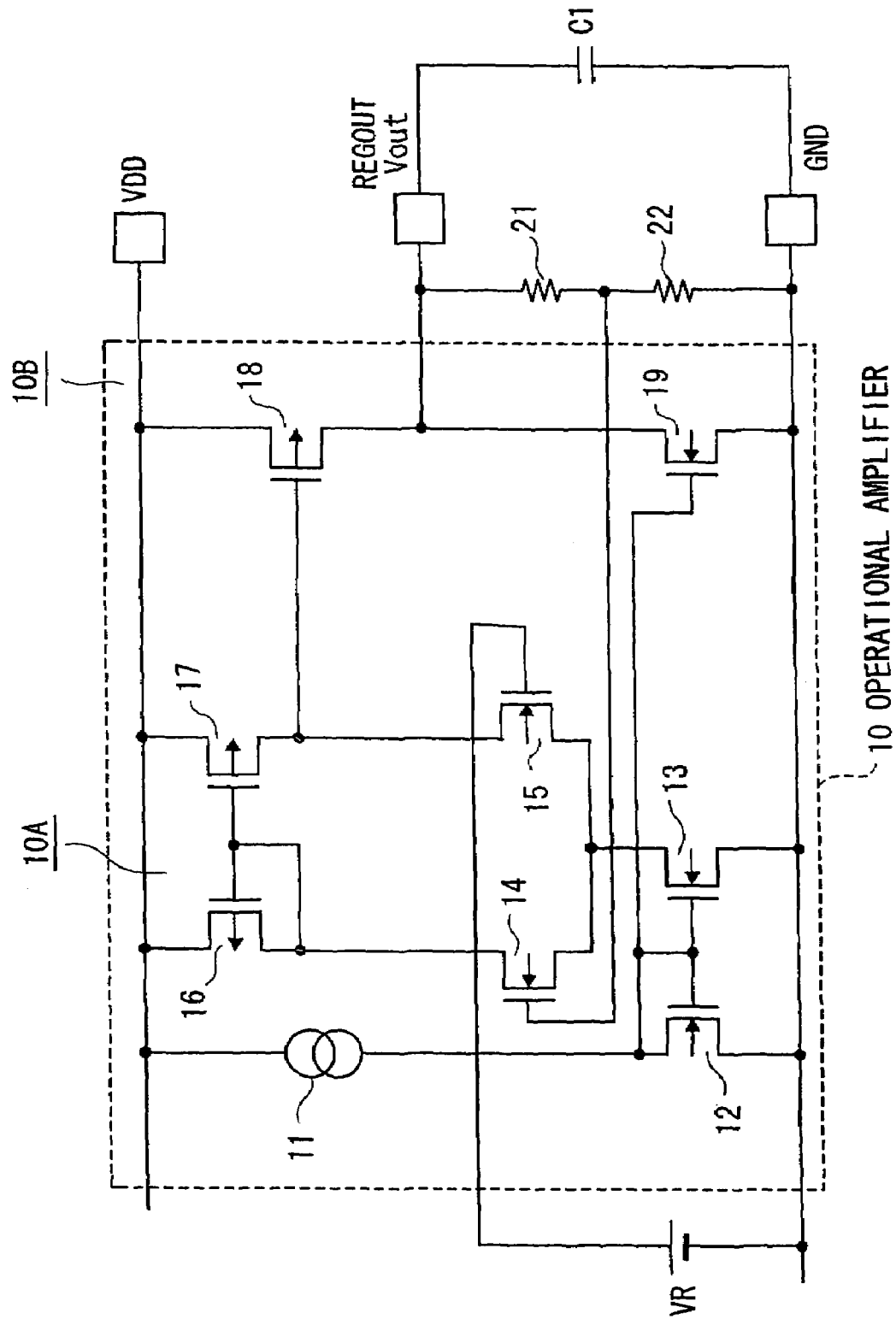
FIG. 6 is a circuit diagram showing a structural example of a conventional step-down regulator.

This amp is used, for example, as a step-down regulator provided at a semiconductor integrated circuit. In the same way as in FIG. 6 showing the conventional art, the amp is structured by using an operational amp 30, and, on the basis of a first input voltage (e.g., a reference voltage of a band gap of about 1 V or the like) VR, outputs a desired output stage output voltage Vout (e.g., about 2V) which is lower than VDD (e.g., about 3 V) from an output stage output node (e.g., an output terminal) REGOUT. Because a large capacitor C1 for stabilization of from several to several 10 μF is connected between the output terminal REGOUT and GND, the operational amp 30 is structured so as to not have a phase compensating capacitor for preventing oscillation.

In addition to the operational amp 30 having an input stage amplifying circuit 30A and an output stage amplifying circuit 30B connected to the output side thereof, which are similar to those of the conventional art of FIG. 6, a negative feedback circuit 50 for phase compensation is newly and additionally connected between the input stage amplifying circuit 30A and the output stage amplifying circuit 30B.

The input stage amplifying circuit 30A has a current source 31 and an NMOS 32, and these are connected in series between the VDD node and the GND. An NMOS 33 for the current source, which, together with the NMOS 32, structures a current mirror circuit, is connected to the NMOS 32. Namely, the gate of the NMOS 33 is connected to the drain and the gate of the NMOS 32, and the sources of the NMOS 32, 33 are connected to the GND.

The sources of a pair of NMOS 34, 35, which structure a differential amplifying section, are commonly connected to the source of the NMOS 33. The gate of the one NMOS 34 is used as an opposite phase input terminal (e.g., an opposite phase input node), and the drain of the NMOS 34 is connected to an opposite phase output node N34. The gate of the other NMOS 35 is used as a positive phase input terminal (e.g., a positive phase input node), and the reference voltage VR is inputted thereto. The drain of the NMOS 35 is connected to a positive phase output node N35.

A pair of PMOS 36, 37, which structure a current mirror circuit, are connected to the opposite phase output node N34 and the positive phase output node N35. The drain and the gate of the one PMOS 36 are connected to the opposite phase output node N34, and the source of the PMOS 36 is connected to the VDD node. The drain of the other PMOS 37 is connected to the positive phase output node N35, the gate of the PMOS 37 is connected to the gate and the drain of the PMOS 36, and the source of the PMOS 37 is connected to the VDD node.

The output stage amplifying circuit 30B has an output transistor (e.g., a PMOS) 38, an NMOS 39 which, together with the NMOS 32, 33, structures a current mirror circuit, and voltage-dividing resistors 41, 42 which structure a voltage-dividing circuit. The PMOS 38 is a transistor which amplifies the input stage output voltage from the positive phase output node N35, and outputs the output stage output voltage Vout from the output terminal REGOUT. The source of the PMOS 38 is connected to the VDD node, the gate of the PMOS 38 is connected to the positive phase output node N35, and the drain of the PMOS 38 is connected to the output terminal REGOUT.

The drain of the NMOS 39 is connected to the output terminal REGOUT, the gate of the NMOS 39 is connected to the drain and the gate of the NMOS 32, and the source of the NMOS 39 is connected to the GND. The voltage-dividing circuit is connected in parallel to the NMOS 39. The voltage-dividing circuit is structured by the voltage-dividing resistors 41, 42 which are connected in series, and the connection point of the voltage-dividing resistors 41, 42 is connected to the gate of the NMOS 34 (the opposite phase input node). The voltage-dividing circuit is a circuit which, by dividing the output voltage Vout, generates a second input voltage and feedback-inputs it to the gate of the NMOS 34 (the opposite phase input node).

The negative feedback circuit 50 for phase compensation has a PMOS 51 for a current source whose output current varies due to the input stage output voltage from the positive phase output node N35, a differential amplifying section to which the output current of the PMOS 51 is supplied and which is formed from a pair of PMOS 52, 53 which differential-amplify the reference voltage VR and the second input voltage from the voltage-dividing resistors 41, 42, and a current mirror circuit formed from NMOS 55, 56 which turn-back the output current of the NMOS 52, 53 and feed-back the positive phase current thereof to the opposite phase output node N34.

The source of the PMOS 51 for the current source is connected to the VDD node, and the gate of the PMOS 51 is connected to the positive phase output node N35 and the gate of the PMOS 38. The sources of the pair of PMOS 52, 53 are commonly connected to the drain of the PMOS 51. The gate of the one PMOS 52 is connected to the gate of the NMOS 35 (the positive phase input node), and the drain of the PMOS 52 is connected to the GND. The gate of the other PMOS 53 is connected to the gate of the NMOS 34 (the opposite phase input node) and to the connection point of the voltage-dividing resistors 41, 42. The drain of the PMOS 53 is connected to the drain and the gate of the NMOS 54.

The gate and the drain of the NMOS 54 are connected to the gate of the NMOS 55, and the source of the NMOS 54 is connected to the GND. The drain of the NMOS 55 is connected to the opposite phase output node N34, and the source of the NMOS 55 is connected to the GND.

The (1) operation in a normal state and the (2) operation in a case in which the output current Iout increases, at the step-down regulator which is structured as described above, will be described next.

(1) Operation in a Normal State

Figure 2:
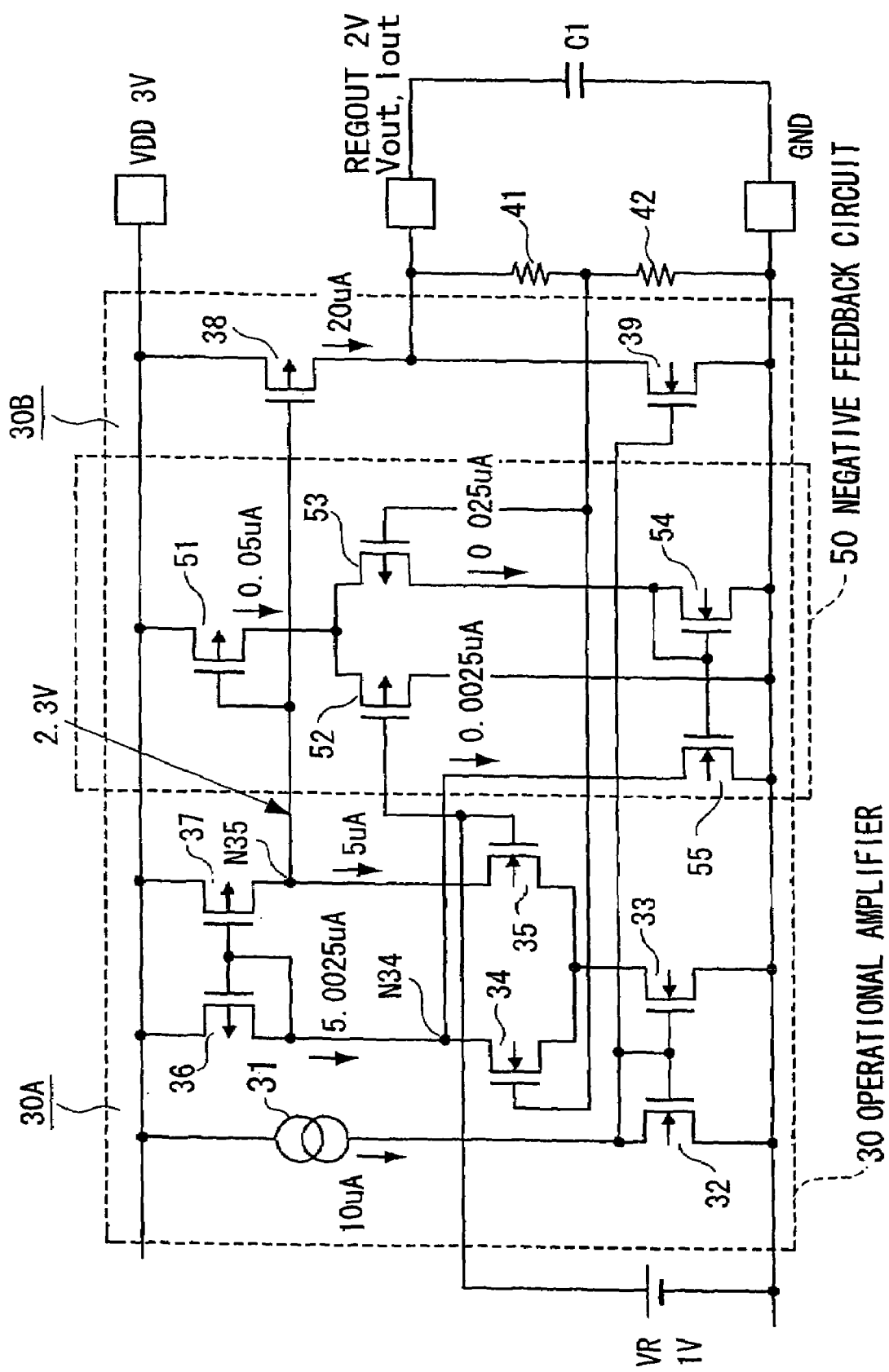
FIG. 2 is a circuit diagram at the time of operation in a normal state at the step-down regulator of FIG. 1.

FIG. 2 is a circuit diagram at the time of operation in a normal state at the step-down regulator of FIG. 1, and examples of voltage values and current values at the time of operation are shown within the circuit.

For example, the reference voltage VR is 1 V, VDD is 3 V, the output voltage Vout of the output terminal REGOUT in a normal state is 2 V, and the capacitor C1 for stabilization which is connected to the output terminal REGOUT is from several to several 10 μF.

For example, if the output current Iout of the output terminal REGOUT (i.e., a current of 20 μA of the PMOS 38) increases due to a fluctuation in load, the current of the PMOS 51, which has a gate in common with the PMOS 38, also increases (0.05 μA).

In this way, the current of the differential amplifying section structured by the PMOS 52, 53 also increases (current of 0.025 μA flowing to each PMOS 52, 53), and the current of the current mirror circuit, which is structured by the NMOS 54, 55 which are connected to this differential amplifying section, also increases (0.5 μA). Because the output terminal of the current mirror circuit (the drain of the NMOS 55) is connected to the opposite phase output node N34 of the current mirror circuit structured by the PMOS 36, 37, the output current of the PMOS 37 increases. As a result, the gate voltage of the PMOS 38 increases, and the current of the PMOS 38 decreases.

When the output current Iout moves so as to increase in this way, the output current Iout works so as to decrease due to the negative feedback circuit 50.

Figure 3A:
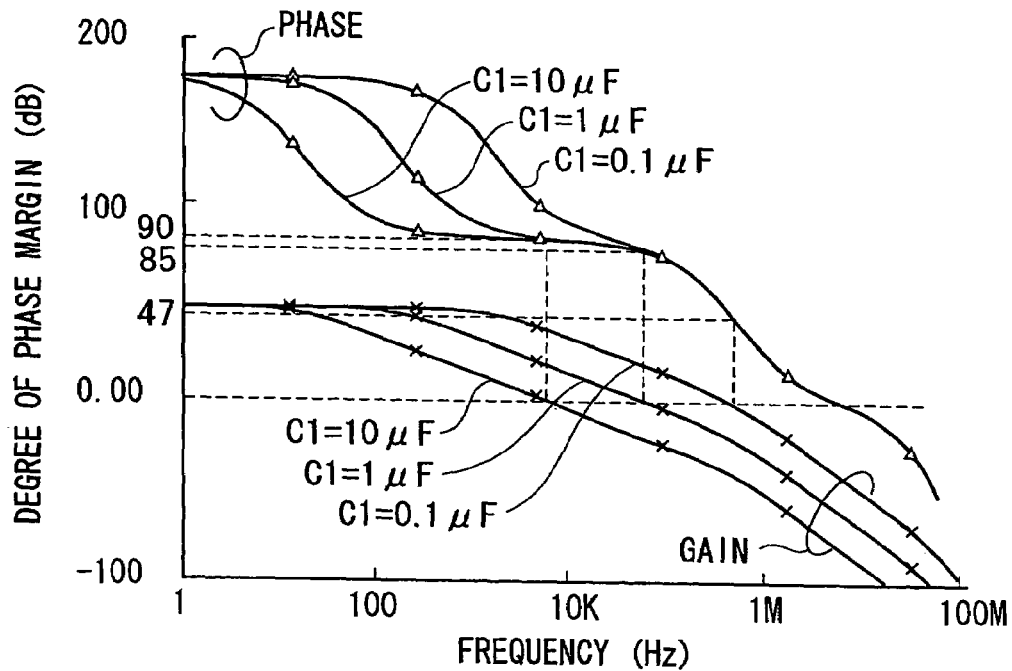
FIG. 3A is a drawings showing a comparison of frequency characteristics (phase margin characteristics) of the step-down regulator of FIG. 1 and a conventional step-down regulator.
Figure 3B:
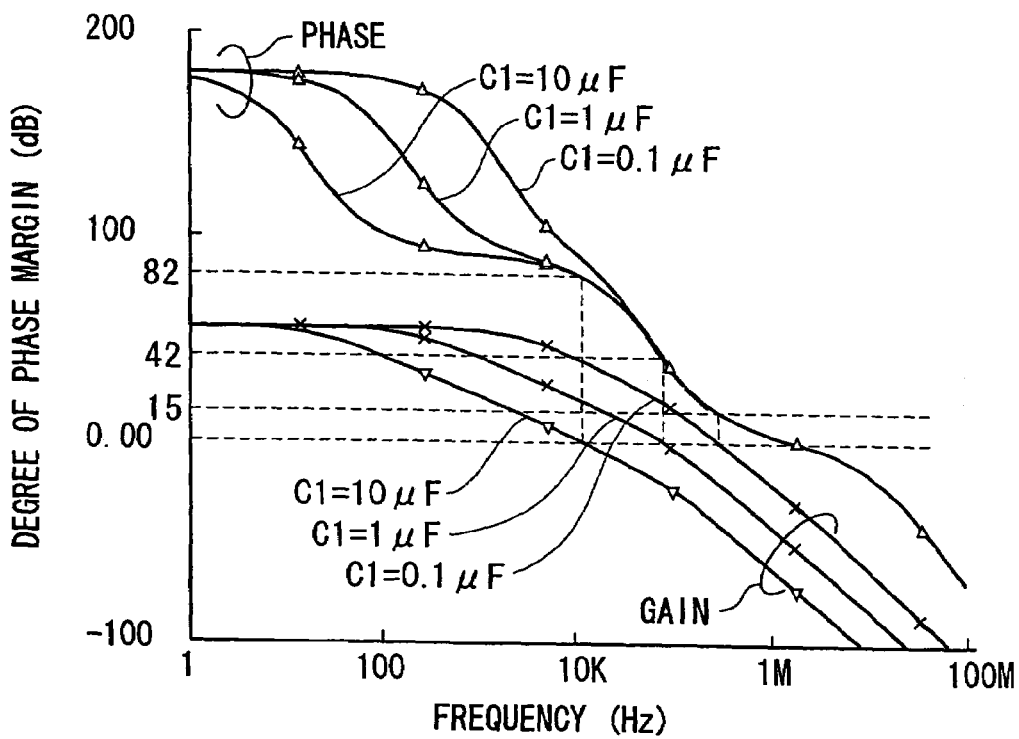
FIG. 3B is a drawings showing a comparison of frequency characteristics (phase margin characteristics) of the step-down regulator of FIG. 1 and a conventional step-down regulator.

FIGS. 3A and 3B are drawings showing a comparison of frequency characteristics (phase margin characteristics) of the step-down regulator of FIG. 1 and the conventional step-down regulator of FIG. 6. FIG. 3A is a frequency characteristic (phase margin characteristic) diagram of FIG. 1, and FIG. 3B is a frequency characteristic (phase margin characteristic) diagram of the conventional art of FIG. 6. The frequency characteristics, in cases in which the value of the capacitor C1 connected to the output terminal REGOUT of the step-down regulator is changed to 0.1 μF, 1 μF, and 10 μF, are shown in FIGS. 3A and 3B.

The phase margin is a parameter expressing the oscillation margin of the circuit. If the phase at the time when the gain becomes 0 dB is greater than or equal to 45°, the circuit converges at a stable point without oscillating.

Comparing FIGS. 3A and 3B, it can be understood that, in FIG. 3A which shows the present first exemplary embodiment, even if the capacitor C1 of the step-down regulator is 0.1 μF, the phase margin is about 47°, and oscillation does not occur. On the other hand, in FIG. 3B showing the conventional art, at 0.1 μF, the phase margin is only about 15°, and the possibility of oscillation is large.

In this way, by connecting the negative feedback circuit 50, a stable circuit which does not oscillate can be obtained even if the capacitor C1 of the step-down regulator is made to be 1/10.

(2) Operation in a Case in which the Output Current Iout Increases

Figure 4:
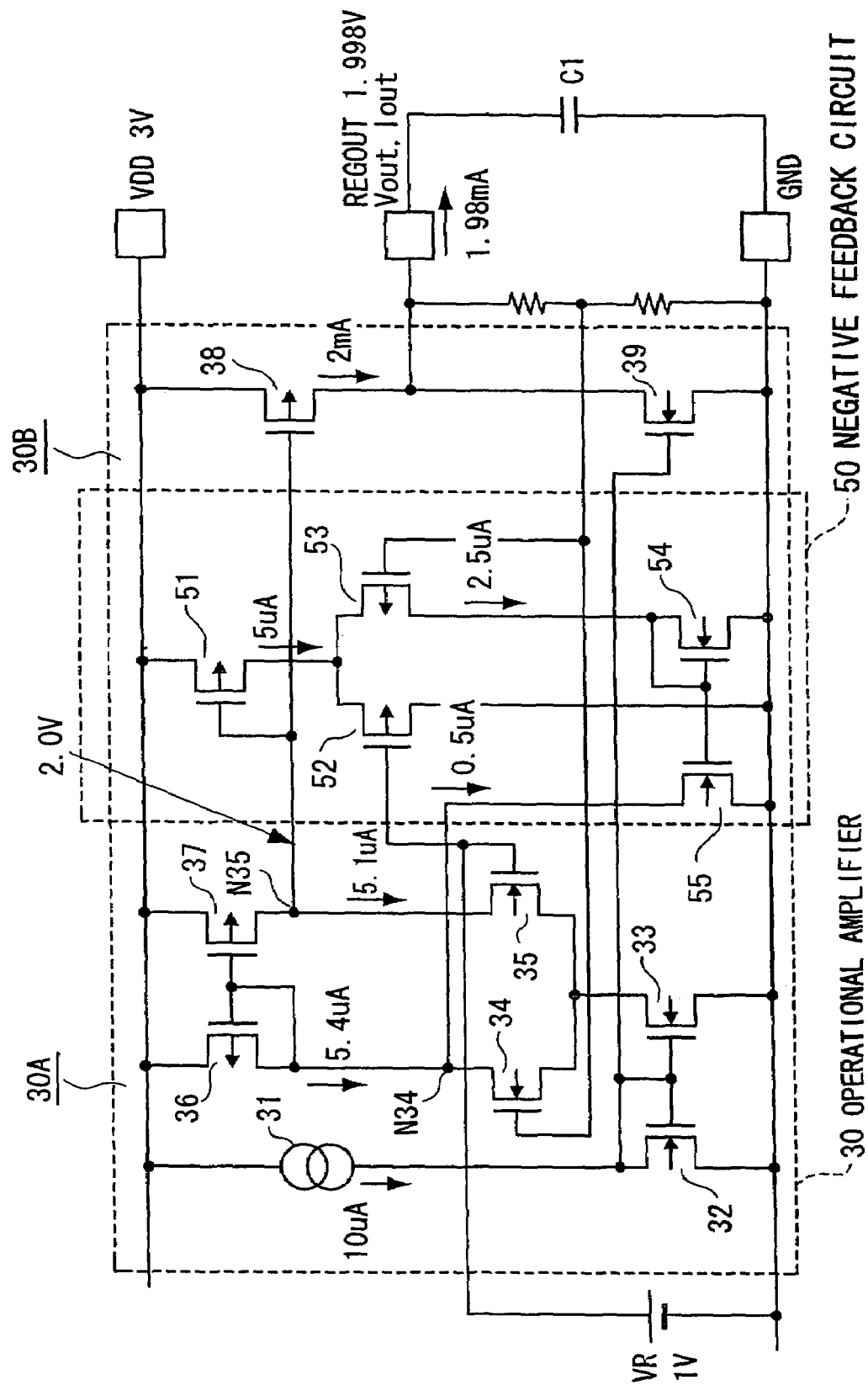
FIG. 4 is a circuit diagram at the time of operation in a case in which output current increases at the step-down regulator of FIG. 1.

FIG. 4 is a circuit diagram at the time of operation in a case in which the output current Iout increases at the step-down regulator of FIG. 1, and examples of voltage values and current values at the time of operation are shown within the circuit.

For example, the reference voltage VR is 1 V, VDD is 3 V, the output voltage Vout of the output terminal REGOUT in a normal state is 2 V, the output current Iout is 2 mA, and the capacitor C1 for stabilization which is connected to the output terminal REGOUT is from several to several 10 μF.

At the time of the start of operation, the output voltage Vout of the output terminal REGOUT increases from 0 V to a constant voltage (2 V). At this time, the capacitor C1 for stabilization which is connected to the output terminal REGOUT is charged, and a large current flows to the PMOS 38 (2 mA).

In this way, the current of the PMOS 51, which has a gate in common with the PMOS 38, also increases (5 μA), and the current of the differential amplifying section structured from the PMOS 52, 53 also increases (current of 2.5 μA flowing to the PMOS 53). Therefore, the current of the current mirror circuit, which is structured by the NMOS 54, 55 which are connected to the differential amplifying section, also increases (0.5 μA). Because the output terminal of the current mirror circuit (the drain of the NMOS 55) is connected to the opposite phase output node N34 of the current mirror circuit structured by the PMOS 36, 37, the output current of the PMOS 37 increases (5.1 μA). As a result, the gate voltage of the PMOS 38 increases, and the current of the PMOS 38 works so as to decrease (1.98 mA).

When the output current Iout moves so as to increase in this way, the output current Iout works so as to decrease due to the negative feedback circuit 50.

Figure 5A:
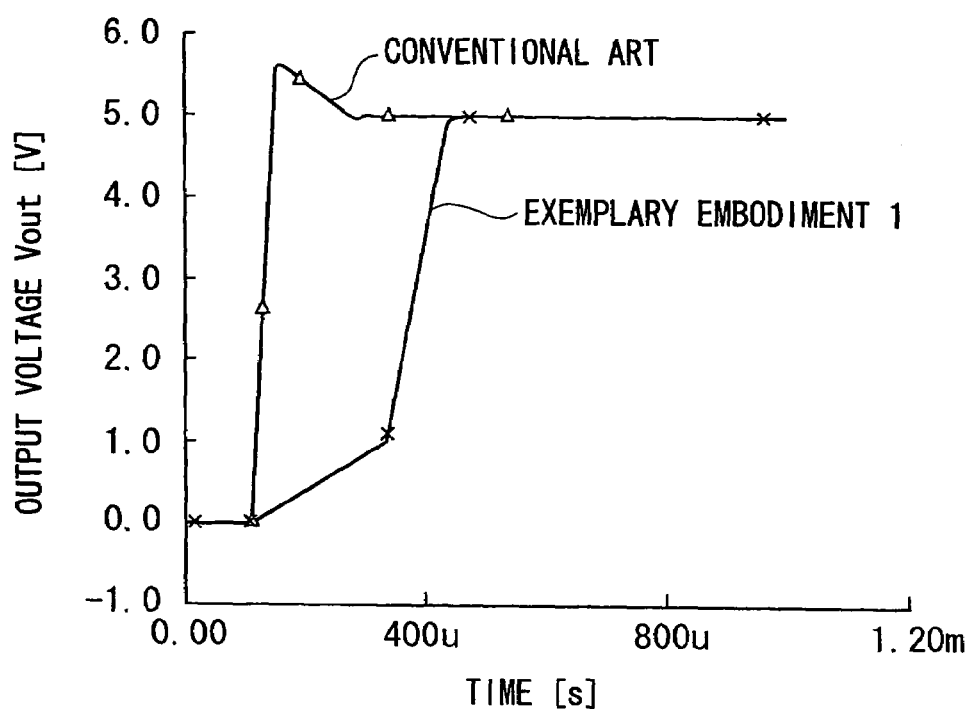
FIG. 5A is a drawing showing a comparison of output voltage characteristics of the step-down regulator of FIG. 1 and the conventional step-down regulator.
Figure 5B:
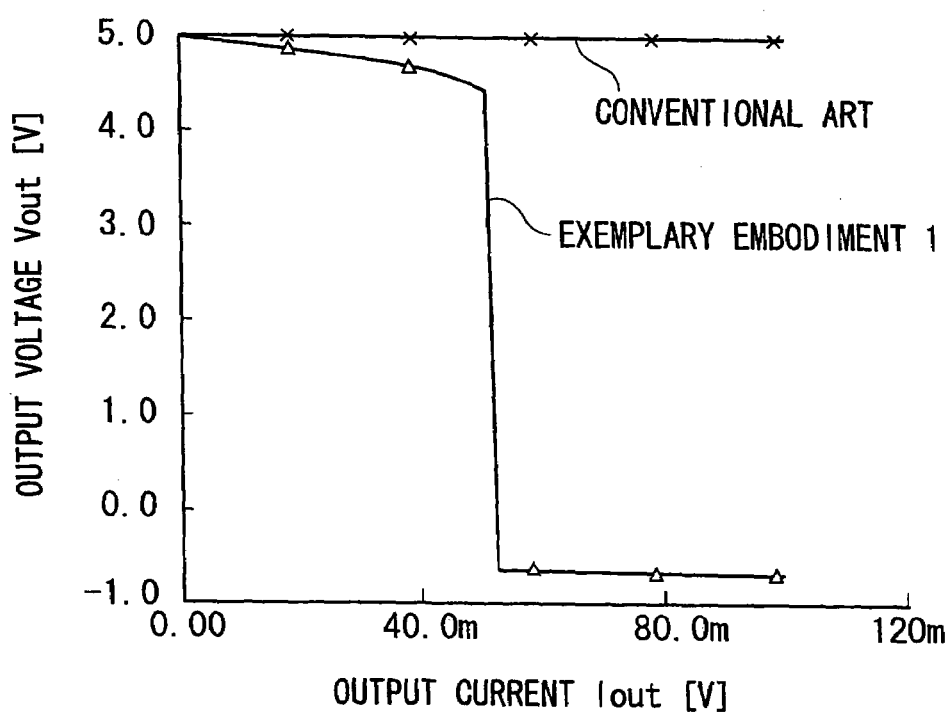
FIG. 5B is a drawing showing a comparison of output voltage characteristics of the step-down regulator of FIG. 1 and the conventional step-down regulator.

FIGS. 5A and 5B are drawings showing a comparison of output voltage characteristics of the step-down regulator of FIG. 1 and the conventional step-down regulator of FIG. 6. FIG. 5A is an output voltage waveform diagram at the time of start of operation, and FIG. 5B is an output voltage characteristic diagram with respect to the output current. Output voltage waveforms at the time of the start of operation, in a case in which the output voltage Vout in a normal state is 5.0 V, are shown in FIGS. 5A and 5B.

As shown in FIG. 5A, it can be understood that, as compared with the conventional art, in the present first exemplary embodiment, because excessive current does not flow due to the negative feedback circuit 50, the constant voltage of 5.0 V is not exceeded and the circuit is stable.

As shown in FIG. 5B, in the conventional art, even if an excessive output current Iout flows, the output voltage Vout remains constant. In contrast, in the present first exemplary embodiment, the output voltage Vout greatly falls at the output current Iout of 52 mA. This is equivalent to having an overcurrent protecting function.

(Results of First Exemplary Embodiment)

In accordance with the present first exemplary embodiment, by providing the negative feedback circuit 50, a stable circuit which does not oscillate can be obtained even if the capacitor C1 for stabilization of the step-down regulator is made to be, for example, about 1/10 of that of the conventional art. Further, by providing the negative feedback circuit 50, there are the effects that changes in the output voltage at the time of the start of operation are made to be stable, and an overcurrent protecting function is provided.

MODIFIED EXAMPLES

Note that the present invention is not limited to the first exemplary embodiment of FIG. 1, and various modifications and forms of use thereof are possible. The structures of following (A) through (C) are examples of such modifications and forms of use.

(A) At the input stage amplifying circuit 30A, the output stage amplifying circuit 30B, and the negative feedback circuit 50 which structure the step-down regulator of FIG. 1, for example, the NMOS and the PMOS structuring the circuits may be substituted and the polarity of the power source may be made to be the opposite, or may be structured by other transistors such as bipolar transistors or the like, or may be changed to another circuit structure other than those illustrated.

(B) FIG. 1 describes an example of a step-down regulator, but the present invention is not limited to the same and can be applied to various circuits such as, for example, by using the negative feedback circuit 50 of FIG. 1, an amp may be structured, or an operational amp may be structured, or the like.

(C) In the case of structuring, for example, an amp in above (B), instead of the reference voltage VR of FIG. 1, the input terminal for input of the input voltage may be connected to the gate of the NMOS 35. Or, in the case of structuring an operational amp, instead of the reference voltage VR of FIG. 1, an opposite phase input terminal may be connected to the gate of the NMOS 34, and a positive phase input terminal may be connected to the gate of the NMOS 35.

What is claimed is:

1. An amplifier comprising:

an input stage amplifying circuit having a positive phase input node, an opposite phase input node, a positive phase output node and an opposite phase output node, and differential-amplifying a first input voltage inputted to the positive phase input node and a second input voltage inputted to the opposite phase input node, and outputting an input stage output voltage from the positive phase output node;

an output stage amplifying circuit amplifying the input stage output voltage and outputting an output stage output voltage from an output stage output node, and generating the second input voltage which corresponds to the output stage output voltage, and feedback-inputting the second input voltage to the opposite phase input node; and a negative feedback circuit having a current source whose output current fluctuates due to the input stage output voltage, and a differential amplifying section to which the output current of the current source is supplied and which differential-amplifies the first input voltage and the second input voltage, the negative feedback circuit feeding-back, to the opposite phase output node, a positive phase current which corresponds to output current of the differential amplifying section.

2. An amplifier comprising:

an input stage amplifying circuit having a positive phase input node, an opposite phase input node, a positive phase output node and an opposite phase output node, and differential-amplifying a first input voltage inputted to the positive phase input node and a second input voltage inputted to the opposite phase input node, and outputting an input stage output voltage from the positive phase output node;

an output stage amplifying circuit having an output transistor which amplifies the input stage output voltage and outputs an output stage output voltage from an output stage output node, and a voltage-dividing circuit which, by dividing the output stage output voltage, generates the second input voltage, and feedback-inputs the second input voltage to the opposite phase input node; and a negative feedback circuit having a current source whose output current fluctuates due to the input stage output voltage, and a differential amplifying section to which the output current of the current source is supplied and which differential-amplifies the first input voltage and the second input voltage, and a current mirror circuit which turns-back output current of the differential amplifying section and feeds-back a positive phase current thereof to the opposite phase output node.

3. A step-down regulator using the amplifier of claim 1, wherein the first input voltage is a reference voltage, a capacitor for stabilization is connected to the output stage output node, and the output stage output voltage is a constant voltage which is lower than a power source voltage applied to the amplifier.

4. A step-down regulator using the amplifier of claim 2, wherein the first input voltage is a reference voltage, a capacitor for stabilization is connected to the output stage output node, and the output stage output voltage is a constant voltage which is lower than a power source voltage applied to the amplifier.

5. An operational amplifier using the amplifier of claim 1, wherein the positive phase input node is a positive phase input terminal, the opposite phase input node is an opposite phase input terminal, the output stage output node is an output terminal, and a capacitor for stabilization is connected to the output terminal.

6. An operational amplifier using the amplifier of claim 2, wherein the positive phase input node is a positive phase input terminal, the opposite phase input node is an opposite phase input terminal, the output stage output node is an output terminal, and a capacitor for stabilization is connected to the output terminal.

7. The amplifier of claim 2, wherein the current source is formed from a transistor of a first conductive type, and the differential amplifying section is formed from a pair of transistors of the first conductive type and a transistor of a second conductive type which is opposite the first conductive type.

8. The amplifier of claim 7, wherein the transistors of the first conductive type are PMOS transistors, and the transistor of the second conductive type is an NMOS transistor.

* * * * *